United States Patent
Wada

(10) Patent No.: US 6,281,528 B1
(45) Date of Patent: Aug. 28, 2001

(54) OHMIC CONTACT IMPROVEMENT BETWEEN LAYER OF A SEMICONDUCTOR DEVICE

(75) Inventor: Shinichi Wada, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/397,070

(22) Filed: Sep. 16, 1999

(30) Foreign Application Priority Data

Sep. 18, 1998 (JP) .................................. 10-264862

(51) Int. Cl.[7] .................. H01L 31/072; H01L 31/109; H01L 31/0328
(52) U.S. Cl. .................. 257/200; 257/194; 257/195; 257/192
(58) Field of Search .................. 257/194, 195, 257/192, 200, 279; 438/172

(56) References Cited

U.S. PATENT DOCUMENTS 5,302,840 * 4/1994 Takikawa .................. 257/194
5,965,909 * 10/1999 Tanaka .................. 257/192
6,072,203 * 6/2000 Nozaki et al. .................. 257/194

* cited by examiner

Primary Examiner—Steven Loke
Assistant Examiner—Douglas W. Owens
(74) Attorney, Agent, or Firm—Sonnenschein, Nath & Rosenthal

(57) ABSTRACT

An electrode having a good contact between a semiconductor substrate and an electrode film is formed in a semiconductor device, and a manufacturing method therefor. On first AlGaAs of a compound semiconductor substrate, a second semiconductor layer of second AlGaAs formed with p-type impurity region is formed, a third semiconductor layer of low resistance GaAs and AlGaAs having a band gap narrower than that of the second semiconductor layer is formed thereon and, further, an electrode film is formed on the third semiconductor layer.

17 Claims, 4 Drawing Sheets

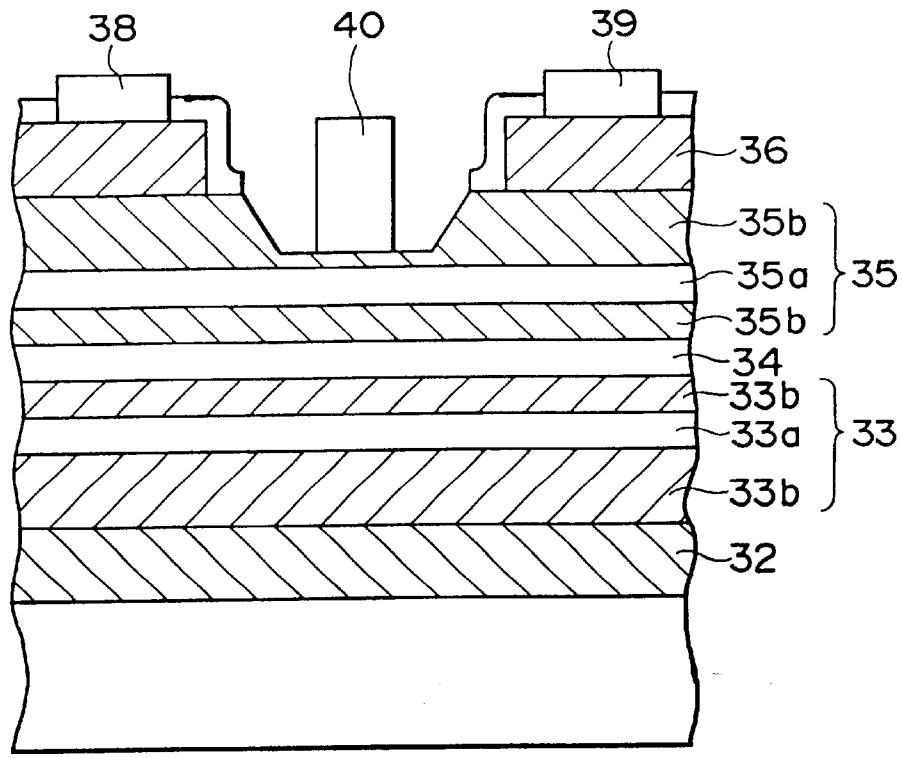
FIG. 5 -- PRIOR ART
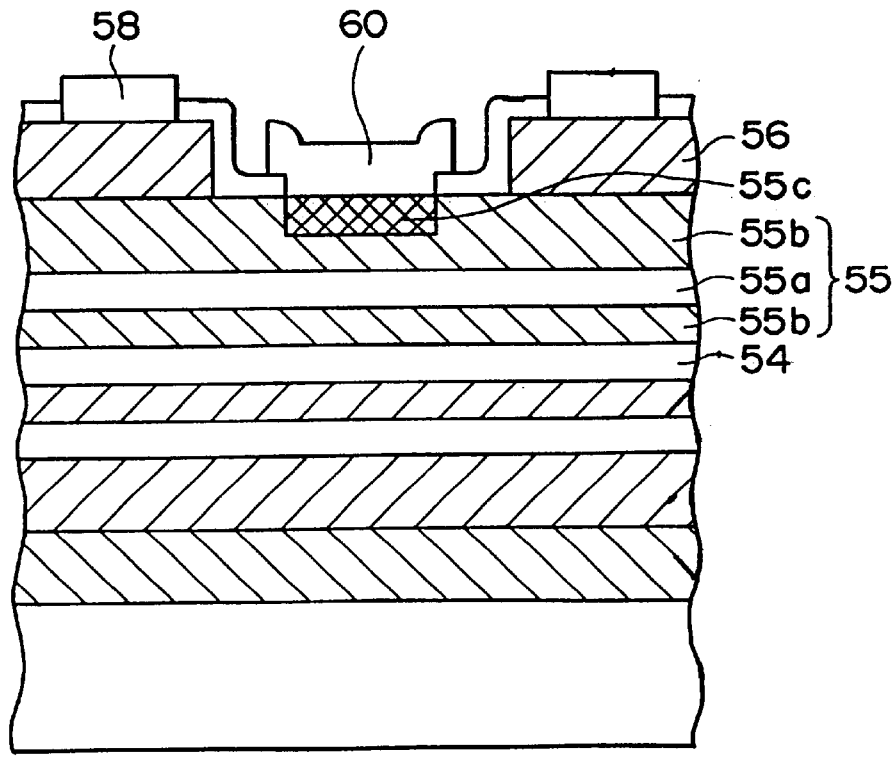
FIG. 6 -- PRIOR ART

OHMIC CONTACT IMPROVEMENT BETWEEN LAYER OF A SEMICONDUCTOR DEVICE

RELATED APPLICATION DATA

The present application claims priority to Japanese Application No. P10-264862 filed Sep. 18, 1998 which application is incorporated herein by reference to the extent permitted by law.

BACKGROUND OF THE INVENTION

1. Field of the Invention

The present invention relates to a compound semiconductor device and a method for manufacturing the same and, more in particular, it relates to an electrode structure of a compound semiconductor, a semiconductor device such as an FET or HEMT, as well as a method of manufacturing the same.

2. Description of Related Art

In recent years, it has been highly demanded for miniaturization and reduction of electric power for terminals in a mobile communication system such as a portable telephone and, accordingly, a performance capable of attaining such miniaturization and reduction of electric power described above has also demanded for devices such as high frequency transistors used in the system. For example, with respect to power amplifiers for use in high frequency of 2 GHz band for digital cellulars having a leading position in current mobile communication, it has been demanded for devices capable that can operate on a single positive power source, can be driven at a lower voltage and at higher efficiency.

At present, a hetero junction field effect transistor (HFET) has been put to practical use as one of devices for high frequency power for use in high frequency power amplifiers in a microwave band and it is adapted to conduct current modulation utilizing hetero junction.

FIG. 5 shows an example for a constitution of HFET. In HFET, a first barrier layer 33 of AlGaAs mixed crystal, a channel layer 34 of InGsAs mixed crystal and a second barrier layer 35 of AlGaAs mixed crystal are laminated successively by way of a buffer layer 32 comprising a semi-insulative single crystals GaAs, and a gate electrode 40 is formed on the second barrier layer 35.

Each of the first and the second barrier layers 33, 35 has a carrier supply region containing n-type impurity 33a, 35a in high resistance region 33b, 35b respectively. When a voltage is applied to the gate electrode 40, a drain current flowing between the source electrode 38 and the drain electrode 39 is modulated in accordance with the change of the applied voltage. Further, in HFET, as shown in FIG. 5, the thickness of the second barrier layer 35 generally is reduced near the gate electrode 40 as a recessed structure, so that a region in which carriers are depleted or carriers are reduced compared with other channel regions is formed in the region of the channel layer just below.

In the HFET having such a structure, since carriers are accumulated in the channel layer 34 by applying a positive voltage to the gate electrode 40, it has a feature that the linearity of gate-source capacity Cgs and mutual conductance Gm to a gate voltage Vg is more excellent, in principle, compared with other devices, for example, junction FET (JFET) or Schottky junction FET (MES-FET: Metal Semiconductor FET). This can provide a significant advantage for improving the efficiency of power amplifiers.

Further, HFET of a structure as shown in FIG. 6 has also been proposed recently. In this structure, p-type impurities are selectively diffused to a portion just beneath a gate electrode 60, specifically, to a portion of a second barrier layer 55 corresponding to the recessed structure shown in FIG. 5, to form a p-type low resistance region 55C (impurity concentration: $1\times10^{19}$ cm$^{-3}$ or higher). The p-type low resistance region 55C is in contact with the gate electrode 60 and in the form of buried in the second barrier layer 55.

In such a structure, since a PN junction is used, a built-in volt is increased and a large positive voltage can be applied to the gate electrode 60, compared with a structure shown in FIG. 5 using a Schottky junction for the gate electrode 40. Accordingly, operation by a single positive power source can be facilitated while possessing excellent linearity of the mutual conductance Gm and the gate-source capacity Cgs of HFET as it is.

However, in the HFET structure in FIG. 6, the gate electrode 60 is in junction with the p-type low resistance region 55C formed in the second barrier layer 55. In a usual semiconductor of a large band gap (for example AlGaAs), it is difficult to obtain a satisfactory ohmic junction with the material for the gate electrode 60 used customarily (for example, a multi-layered structure: Ti/Pt/Au in view of the junction) compared with GaAs. As a result, the gate resistance is increased tending to cause degradation of high frequency characteristics.

In FIG. 6, elements 52, 53, 53a, 53b, 56, 58, and 59 correspond, respectively, to elements 32, 33, 33a, 33b, 36, 38, and 39 described above with reference to FIG. 5.

SUMMARY OF THE INVENTION

The present invention has been accomplished in order to overcome such problems and an object thereof is to provide a semiconductor device which can operate easily with a single positive power source, and which is excellent in the linearity of mutual conductance Gm and source-gate capacity Cgs relative to gate voltage Vg.

Another object of the invention is to provide a compound semiconductor device for use in high frequency such as JFET or HEMT capable of avoiding degradation of high frequency characteristics by adopting satisfactory ohmic junction for the junction between the gate electrode and the p-type low resistance region, as well as a method for manufacturing such a semiconductor device.

The first invention of the present application provides a semiconductor device comprising a first semiconductor layer, a second semiconductor layer of a first conduction type formed in the first semiconductor layer, a third semiconductor layer of the first conduction type formed on the second semiconductor layer and an electrode film formed on the third semiconductor layer.

The second invention of the present application provides a semiconductor device comprising a semiconductor substrate, a buffer layer formed on the semiconductor substrate, a first barrier layer formed on the buffer layer, a channel layer formed on the first barrier layer, a second barrier layer formed on the channel layer, a second semiconductor layer formed on the first semiconductor layer in the second barrier layer, a third semiconductor layer formed on the second semiconductor layer and an electrode film formed on the third semiconductor layer.

Further, the third invention of the present application provides a method for manufacturing a field effect transistor comprising:

a step of forming a buffer layer on a semiconductor substrate, a step of forming a first barrier layer on the buffer layer, a step of forming a channel layer on the first barrier layer, a step of forming a second barrier layer on the channel layer, a step of forming a first semiconductor layer formed on the second barrier layer, a step of forming an insulation film on the first semiconductor layer, a step of aperturing the insulation film to form openings, a step of forming a third semiconductor layer to the second semiconductor layer in the second barrier layer of the opening, a step of forming a fourth semiconductor layer on the third semiconductor layer and a step of forming an electrode film on the first semiconductor layer and the fourth semiconductor layer.

In accordance with the semiconductor device and the manufacturing method therefor of the present invention, a satisfactory ohmic junction can be formed, by forming the first low resistance region to the semiconductor layer, forming a second low resistance region in the first low resistance region, setting a band gap of the second low resistance region smaller than that of the first low resistance region and, further, depositing the electrode film.

Further, when such an ohmic junction is applied, for example, to JFET or HEMT, the gate resistance can be reduced remarkably.

DESCRIPTION OF THE ACCOMPANYING DRAWINGS

FIG. 5 is a schematic cross sectional structural view for a semiconductor device of the related art; and FIG. 6 is a schematic cross sectional structural view for a semiconductor device of the related art.

DESCRIPTION OF THE PREFERRED EMBODIMENTS

The present invention is to be explained by way of preferred embodiments with reference to the accompanying drawings.

First Preferred Embodiment

Figure 1:
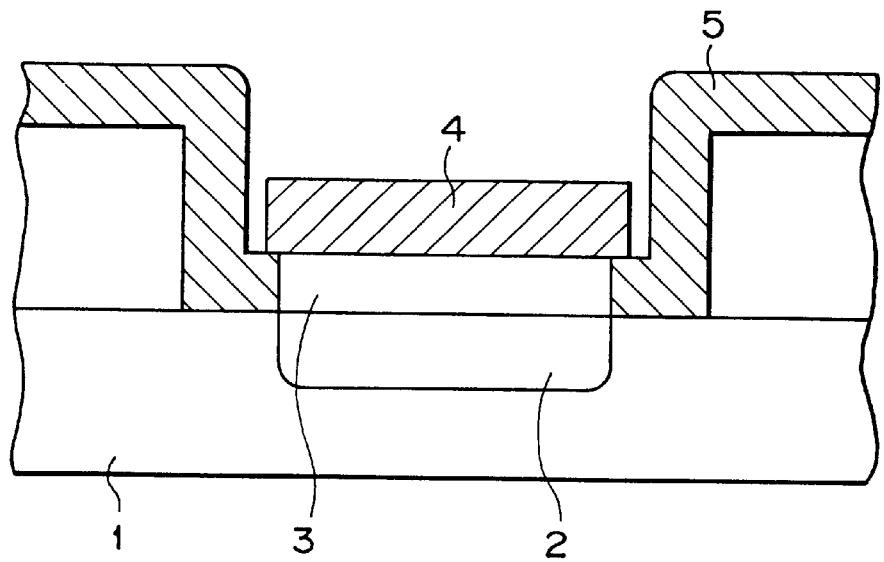
FIG. 1 is a schematic cross sectional structural view of a semiconductor device according to a first embodiment of the present invention.

The present invention provides a semiconductor device comprising, as shown in FIG. 1, AlGaAs 1 as a first semiconductor layer not containing impurities, an AlGaAs region 2 containing p-type impurity, for example, Zn, as a first semiconductor region of a first conduction type formed in the first semiconductor region, a low resistance p-type GaAs region 3 or p-type AlGaAs layer (3) containing, for example, zinc (Zn), as a second semiconductor region of a first conduction type formed on the first semiconductor region, and an electrode film 4 formed on the second semiconductor region.

Further, satisfactory ohmic properties can be obtained for the junction between the second semiconductor region (3) and the electrode film 4 by setting the band gap of the second semiconductor region 3 narrower than that of the first semiconductor region 2.

Further, satisfactory PN junction of excellent linearity and with less resistance component at high frequency can be obtained by setting the conduction type of the first semiconductor layer or a semiconductor layer therebelow different from that of the first and the second semiconductor regions.

EXAMPLE

The present invention is to be explained by way of examples with reference to the drawings.

Example 1

Figure 2:
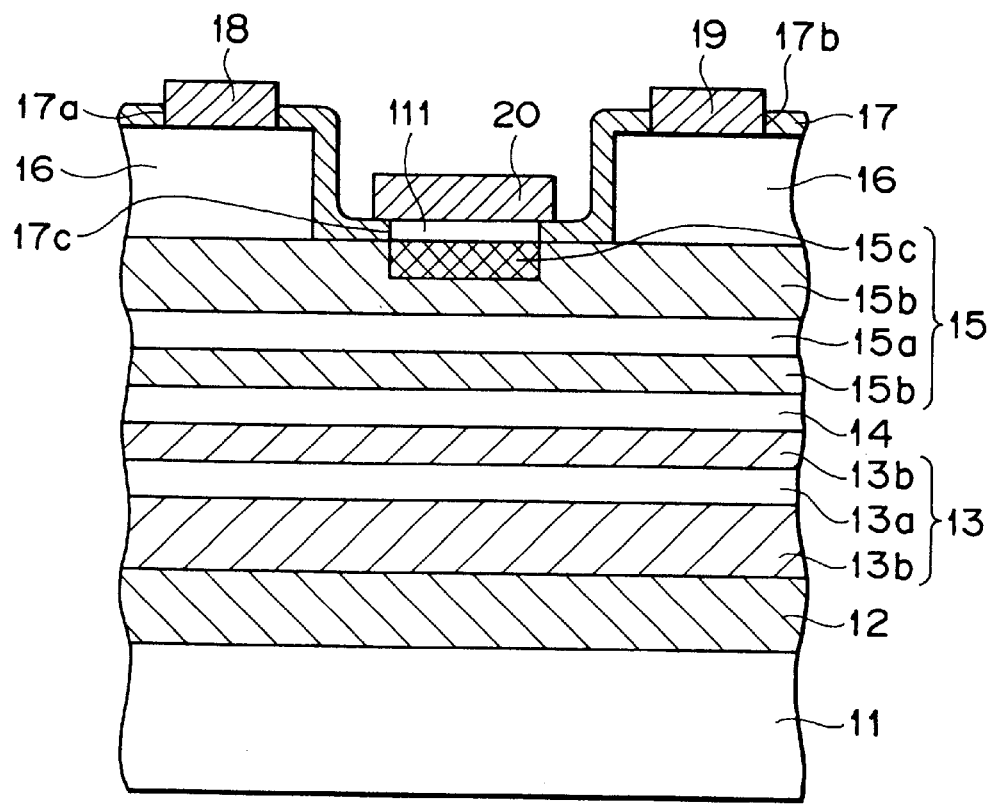
FIG. 2 is a schematic cross sectional structural view of a semiconductor device of Example 1 according to the present invention.

The present invention is to be explained in details by way of Example 1 with reference to the drawings. FIG. 2 shows a structure of a semiconductor device according to the example of the present invention. In the semiconductor device, a first barrier layer 13 comprising a III-V group compound semiconductor, a channel layer 14 and a second barrier layer 15 are laminated successively by way of a buffer layer 12 comprising undoped-GaAs with no addition of impurity on a semiconductor substrate 11 comprising, for example, semi-insulative single crystal GaAs.

On the second barrier layer 15, the cap layer 16 is laminated at an appropriate distance considering a gate length and a channel length. An insulation film 17 is deposited to a thickness of about 300 nm on the cap layer 16 and the second barrier 15. Openings 17a, 17b are disposed in the insulation film 17 corresponding to the two patterned cap layers 16, 16 respectively, and a source electrode 18 and a drain electrode 19 are formed by way of the openings on the cap layers 16. Further, a gate electrode 20 is formed so as to be in contact with a second p-type low resistance region 111 formed on the first p-type low resistance region 15c.

The first barrier layer 13 comprises a semiconductor having a band gap wider than that of the semiconductor constituting the channel layer 14. For example, AlGaAs mixed crystals are preferred, in which compositional ratio (X) of aluminum (AL) is usually: X=0.2 to 0.3. Further, the first barrier layer 13 has a carrier supply region 13a containing n-type impurity at high concentration and a high resistance region 13b not containing impurity. The first barrier layer 13 has a structure in which a high resistance region 13b not containing impurity at a thickness of about 200 nm, a carrier supply layer 13a with addition of silicon at about $1.0 \times 10^{12}$ to $2.0 \times 10^{12}/cm^2$ as an n-type impurity at a thickness of 4 nm, and a high resistance region 13b with no addition of impurity at a thickness of 2 nm are laminated successively from the side of the semiconductor substrate 11.

The channel layer 14 is a current path between the source electrode 18 and the drain electrode 19 and comprises a semiconductor having a band gap narrower than that of the semiconductor constituting the first and the second barrier layers 13, 15. For example, InGaAs mixed crystals are preferred and usually comprise undoped-InGaAs mixed crystals with no addition of impurity usually at an indium (In) compositional ratio (X) of X=0.1 to 0.2. In this structure, carriers supplied from the carrier supply region 13a of the first barrier layer 13 and a carrier supply region 15a of the second barrier layer 15 described later are accumulated in the channel layer 14.

The second barrier layer 15 comprises a semiconductor having a band gap wider than that of the semiconductor constituting the channel layer 14. For example, AlGaAs mixed crystals are preferred in which aluminum (Al) compositional ratio (X) is : X=0.2 to 0.3. Further, the second barrier layer 15 has a carrier supply region 15a containing n-type impurity at high concentration, a high resistance region 15b not containing impurity and a first p-type low resistance region 15c containing p-type impurity at high concentration and disposed corresponding to the gate electrode 20.

The second barrier layer 15 has a structure in which a high resistance region 15b with no addition of impurity at a thickness of 2 nm, a carrier supply region 15a with addition of silicon at about $1.0 \times 10^{12}$ to $2.0 \times 10^{12}/cm^2$ as an n-type impurity at a thickness of 4 nm and a high resistance region 15b with no addition of impurity at a thickness of 75 nm are laminated successively from the side of the channel layer 14, and a first p-type low resistance region 15c at a p-type impurity concentration of about $10^{19}$ cm$^{-3}$ is formed being buried in the high resistance region 15b The first p-type low resistance region 15c is formed by diffusing a p-type impurity, for example, zinc (Zn) to a portion of the high resistance region 15b. Further, a second p-type low resistance region 111 is laminated on the first p-type low resistance region 15c, and it is in contact with the gate electrode 20 in a state buried in the opening 17c disposed in the insulation film 17. The thickness is set to about 50 to 300 nm.

The second p-type low resistance region 111 comprises a semiconductor having a band gap narrow than that of the semiconductor constituting the first p-type low resistance region 15c and the resistance of which can be lowered. For example, GaAs is preferred and the p-type impurity concentration is about $2.0 \times 10^{19}$ cm$^{-3}$. The second p-type low resistance region 111 is formed by adding the p-type impurity while epitaxially growing the same selectively in the opening 17c. With the structure of laminating the second p-type low resistance region 111 on the first p-type low resistance region 15c and joining the gate electrode 20 to the second p-type low resistance region 111 as described above, more excellent ohmic junction can be obtained and the gate resistance can be reduced remarkably compared with a case of directly joining the gate electrode 20 to the first p-type low resistance region 15c.

The cap layer 16 has a thickness, for example, of 50 to 100 rm and comprises GaAs with addition of silicon to about $4 \times 10^{18}$ cm$^{-3}$ as the n-type impurity. The insulation film 17 comprises, for example, silicon nitride $Si_3N_4$ at 300 nm. The source electrode 18 and the drain electrode 19 are formed by laminating gold germanium, nickel Ni and gold Au successively from the side of the substrate and alloying them and are in ohmic contact with the cap layer 16. The gate electrode 20 is formed by successively laminating titanium Ti, platinum Pt and gold Au from the side of the substrate.

According to this semiconductor device, since the second barrier layer 15 comprising a semiconductor having a band gap wider than that of the semiconductor constituting the channel layer 14 between the channel layer 14 and the gate electrode 20, carriers can be accumulated efficiently in the channel layer 14, dependence of the mutual conductance Gm and the gate-source capacity Cgs on the gate voltage Vg is reduced and the power application efficiency can be improved. Further, since the first p-type low resistance region 15c is disposed to the second barrier layer 15, the built-in voltage is increased compared with the case of using the Schottky barrier and a high positive voltage can be applied to the gate electrode 20.

Then, when a positive voltage is applied to the gate electrode 20, turned-ON resistance Ron of the channel layer 14 can be lowered, leaving no parasitic resistance component in the channel layer 14 and high power application efficiency can be attained. As a result, it can be operated easily by a single positive power source. Further, since the second p-type low resistance region 111 having a band gap narrower than that of the semiconductor constituting the second barrier layer 15 and the resistance of which can be lowered is disposed between the gate electrode 20 and the first p-type low resistance region 15c in the barrier layer, satisfactory ohmic contact with the gate electrode 20 can be obtained and the gate resistance can be lowered remarkably to improve the high frequency characteristics.

Example 2

A method of manufacturing a semiconductor device as Example 2 according to the present invention is to be explained in details with reference to the drawing.

Figure 3A:
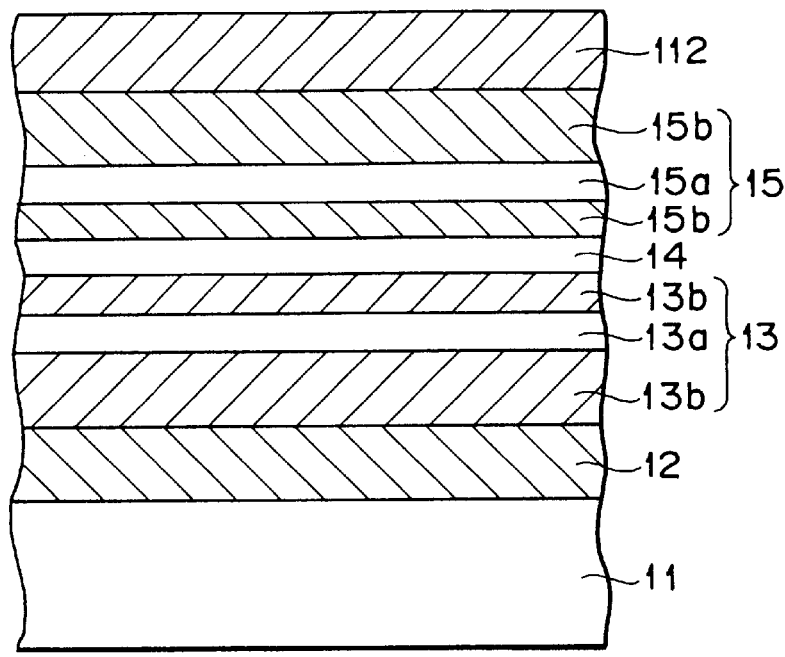
FIG. 3A and FIG. 3B are schematic cross sectional structural views for the process of a manufacturing method for a semiconductor device as Example 2 according to the present invention.

At first, for example, as shown in FIG. 3A, after forming, a buffer layer 12 by epitaxially growing an undoped-GaAs layer with no addition of impurity on a semiconductor substrate 11, for example, made of GaAs, an undoped-AlGaAs layer with no addition of impurity for instance, an n-type AlGaAs with addition of silicon as n-type impurity and an undoped-AlGaAs layer with no addition of impurity are, for example, grown successively epitaxially thereover to form a first barrier layer 13 comprising a lamination of a high resistance region 13b, a carrier supply region 13a and a high resistance region 13b.

As the starting materials for epitaxially growing GaAs with no addition of impurity, trimethyl gallium (TMGa) and arsin (AsH$_3$) are used, while the starting materials for GaAs with addition of impurity are, for example, trimethyl gallium (TMGa), arsin (AsH$_3$) diluted with H$_2$ to 10% and silane (SiH$_4$) diluted with H$_2$ to 100 ppm.

Then, after forming, for example, a channel layer 14 by epitaxially growing an undoped-InGaAs layer with no addition of impurity on the first barrier layer 13, an undoped-AlGaAs layer with no addition of impurity, an n-type AlGaAs layer with addition of silicon as the n-type impurity and an undoped-AlGaAs layer with no addition of impurity are, for example, grown successively epitaxially thereon to form a high resistance region 15b, a carrier supply region 15a and a high resistance region 15b of the second barrier layer 15 are formed.

The group III starting material for growing InGaAs can include a combination of trimethyl indium (TMIn) and triethyl gallium (TEG), as well as a combination of triethyl indium (TEIn) and TEG, TMIn and trimethyl gallium (TMGa), and TEIn and TMGa. The group V starting material can include arsin (AsH$_3$).

As the starting materials for growing aluminum gallium arsenide (AlGaAs), the starting material for gallium can include trimethyl gallium (TMGa) or triethyl gallium (TEG) and the starting material for arsenic can include arsin (AsH$_3$). Further, the starting material for aluminum can include triethyl aluminum (TeAl), as well as trimethyl aluminum (TMAl), dimethyl aluminum hydride, triisobutyl aluminum, diisobutyl aluminum and trimethyl amine alane, and each of the compound layers is formed by using, for example, an MBE method, GSMBE method or MOMBE method.

Successively, an n-type GaAs layer 112 to form a cap layer 16 with addition, for example, of silicon as the n-type impurity is epitaxially grown on the high resistance region 15b.

For epitaxial growing, the starting material to be used can include, for example, trimethyl gallium (TMGa), arsin (AsH$_3$) and silane (SiH$_4$) diluted with H$_2$.

Subsequently, the epitaxial layer other than an FET forming portion not illustrated is removed by mesa etching to conduct device isolation.

Figure 3B:
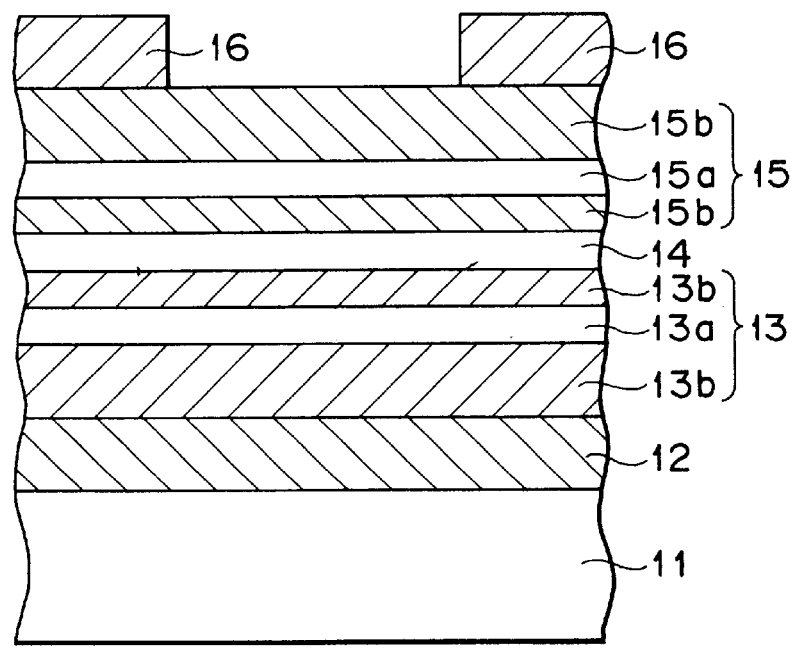

Then, as shown in FIG. 3B, the n-type GaAs layer 112 is selectively removed by etching to form the cap layer 16, and the high resistance region 15b of the second barrier layer 15 is exposed in the gate electrode forming region.

As an etching solution for GaAs, a mixed solution, for example, of citric acid:aqueous hydrogen peroxide:aqueous ammonia:water can be used in this process.

Figure 4A:
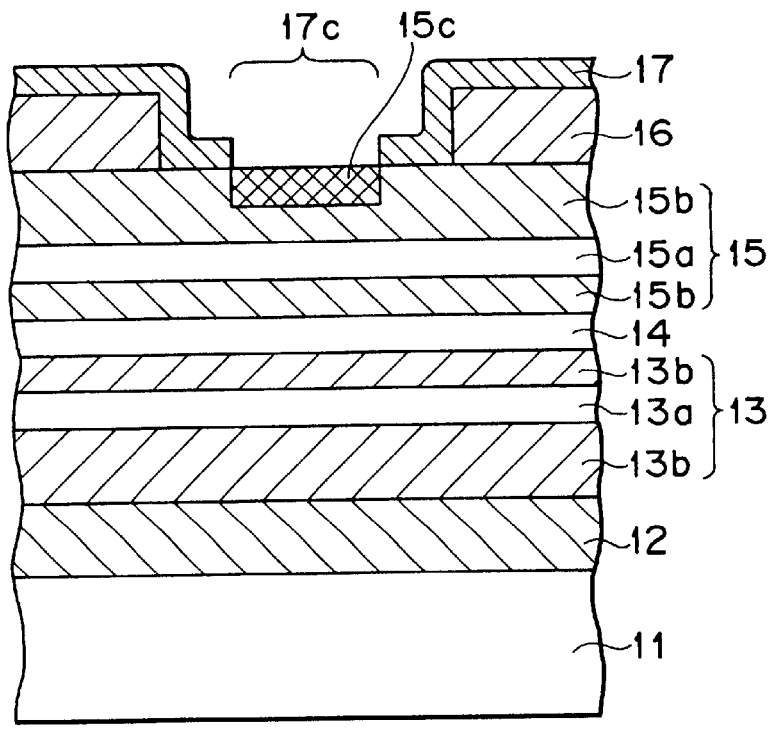
FIG. 4A and FIG. 4B are schematic cross sectional structural views for the process of a manufacturing method for a semiconductor device as Example 2 according to the present invention.

Successively, as shown in FIG. 4A, an insulation film 17 is formed by depositing a silicon nitride film on the cap layer 16 and the high resistance region 15b of the second barrier layer 15, for example, by a CVD (Chemical Vapor Deposition) method. Then, the insulation film 17 is selectively removed by etching to form an opening 17c in the gate electrode forming region, and zinc Zn as the p-type impurity is diffused into the high resistance region 15b of the second barrier layer 15 at a temperature, for example, of about 600° C. to form a p-type low resistance region 15c.

The diffusion method adopted herein is conducted for instance by gas phase diffusion method by introducing arsin (AsH$_3$) and diethyl zinc (DEZ) using hydrogen as a carrier gas into a reactor core tube in which a wafer is set. Arsin (AsH$_3$) is used for preventing evaporation of arsenic As having a high vapor pressure from the surface of the high resistance region 15b. Diethyl zinc (DEZ) is an organic compound of zinc Zn as the p-type impurity, which is introduced by carrier gas bubbling into a reactor core tube and this is a general diffusion source in a gas phase diffusion of compound semiconductors.

Figure 4B:
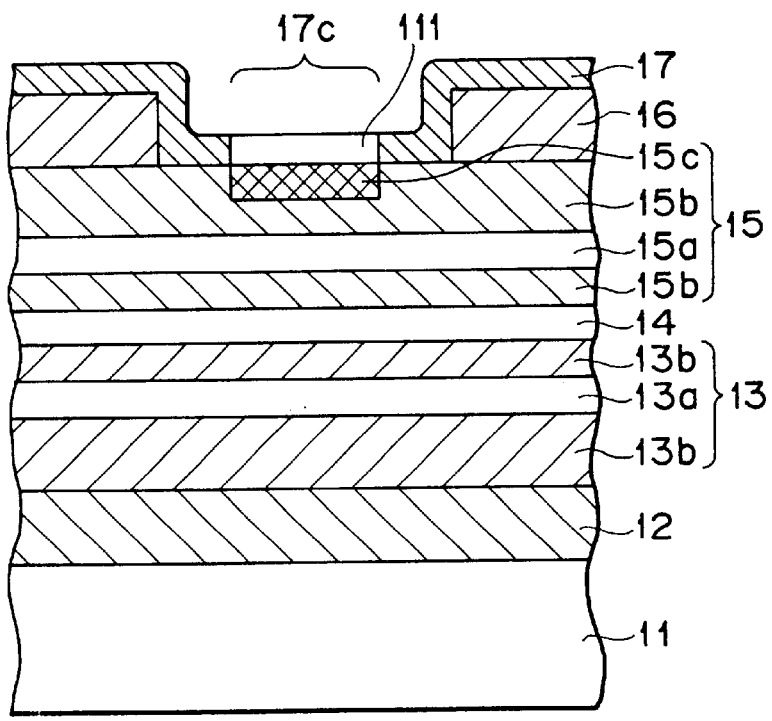

After forming the first p-type low resistance region 15c, as shown in FIG. 4B, a second p-type low resistance region 111 is epitaxially grown selectively in the opening 17c formed in the insulation film 17. In this case, after forming the first p-type low resistance region 15c by diffusing zinc Zn as the p-type impurity, the second p-type low resistance region 111 can be grown epitaxially in the reactor core tube successively. p-type low resistance GaAs can be grown by introducing trimethyl gallium TMGa as the starting material for gallium Ga into the reactor core tube in addition to arsin AsH$_3$, diethyl zinc DEZ and hydrogen as a gas system introduced upon diffusion. Trimethyl gallium TMGa used in this process is a general starting material for gallium in epitaxial growing of compound semiconductors.

After forming the second p-type low resistance region 111, titanium Ti, platinum Pt and gold Au are, for example, vapor deposited successively thereon and patterned applied to form a gate electrode 20.

Then, the insulation film 17 is selectively removed by etching to aperture openings 17a and 17b in the source electrode forming region and the drain electrode forming region respectively, on which gold germanium alloy AuGe and nickel Ni are, for example, deposited successively and then patterned.

Successively, they are alloyed by heat treatment, for example, at about 400° C. to form a source electrode 18 and a drain electrode 19, to complete a semiconductor device shown in FIG. 2.

As described above, since a barrier layer having a p-type low resistance region having a band gap wider than that of the semiconductor constituting the channel is disposed between the channel layer and the gate electrode, carriers can be accumulated efficiently in the channel layer to improve the linearity of the mutual conductance and the gate-source capacity relative to the gate voltage. In addition, since the second p-type low resistance region 111 having a band gap narrower than that of the barrier layer is formed on the barrier layer, a semiconductor device having satisfactory ohmic characteristics can be obtained.

What is claimed is:

1. A semiconductor device, comprising:
   a substrate;
   a first semiconductor layer comprising a layer of a first conduction type formed on the substrate;
   a second semiconductor layer formed on said first semiconductor layer, said second semiconductor layer having a smaller band gap than that of said first semiconductor layer;
   a third semiconductor layer comprising a layer of a first conduction type formed on said second semiconductor layer, said third semiconductor layer having a larger band gap than that of said second semiconductor layer;
   a first low resistance region of a second conduction type formed in said third semiconductor layer;
   a second low resistance region of a second conduction type formed on said first low resistance region, said second low resistance region having a smaller band gap than that of the first resistance region; and
   a gate electrode formed on said second low resistance region whereby ohmic contact is made.

2. A semiconductor device as claimed in claim 1, further comprising:
   a fourth semiconductor layer of a first conduction type formed on said third semiconductor layer other than the region where said gate electrode is formed; and a source electrode and a drain electrode electrically insulated from each other and formed on the fourth semiconductor layer.

3. A semiconductor device as claimed in claim 1, wherein said first semiconductor layer comprises a high resistance region not containing impurities and a carrier supply region containing impurities of the first conduction type.

4. A semiconductor device as claimed in claim 1, wherein said third semiconductor layer comprises a high resistance region not containing impurities and a carrier supply region containing impurities of the first conduction type.

5. A semiconductor device as claimed in claim 3, wherein said third semiconductor layer comprises a high resistance region not containing impurities and a carrier supply region containing impurities of the first conduction type.

6. A semiconductor device as claimed in claim 2, wherein said second semiconductor layer is a channel layer, which constitutes current path between the source electrode and the drain electrode.

7. A semiconductor device as claimed in claim 1, wherein each of said first semiconductor layer and said third semiconductor layer comprises Al$_x$GaAs (where 0<x<1).

8. A semiconductor device as claimed in claim 7, wherein said second low resistance region comprising GaAs.

9. A semiconductor device as claimed in claim 1, wherein said first low resistance layer is formed within a region of said third semiconductor layer.

10. A semiconductor device, comprising:

a semi-insulating substrate;

a first semiconductor first layer comprising a layer of a first conduction type formed on the substrate a second semiconductor layer formed on said first semiconductor layer, said second semiconductor layer having a smaller gap than that of said first semiconductor layer;

a third semiconductor layer comprising a layer of a first conduction type formed on said second semiconductor layer, said third semiconductor having a larger band gap than that of said second semiconductor layer, in which said first semiconductor layer and said third semiconductor layer have a function of supplying carriers to said second semiconductor layer;

a first low resistance region of a second conduction type formed in said third semiconductor layer, and a second low resistance region of a second conduction type having a small band gap that that of said first low resistance region formed on said first low resistance region; and a gate electrode formed directly on said second low resistance region whereby ohmic contact is made.

11. A semiconductor device as claimed in claim 10, wherein said substrate comprises GaAs and a buffer layer comprising GaAs is disposed between the substrate and said first semiconductor layer.

12. A semiconductor device as claimed in claim 10, further comprising:

a fourth semiconductor layer of a first conduction type formed on said third semiconductor layer other than the region where said gate electrode is formed, and a source electrode and a drain electrode electrically insulated from each other and formed on said fourth semiconductor layer.

13. A semiconductor device as claimed in claim 10, wherein at least one of said first semiconductor layer and said third semiconductor layer include a high resistance region not containing impurities and a carrier supply region containing impurities of said first conduction type.

14. A semiconductor device as claimed in claim 12, wherein said second semiconductor layer is a channel layer, which constitutes a current path between the source electrode and the drain electrode.

15. A semiconductor device as claimed in claim 10, wherein each of said first semiconductor layer and said third semiconductor layer comprises $Al_xGaAs$ (where $0<x<1$).

16. A semiconductor device as claimed in claim 15, wherein said second low resistance region comprises GaAs.

17. A semiconductor device as claimed in claim 10, wherein said first low resistance layer is formed within a region of said third semiconductor layer.

* * * * *